United States Patent
Kwon et al.

(10) Patent No.: US 9,922,850 B2
(45) Date of Patent: Mar. 20, 2018

(54) APPARATUS FOR TREATING SUBSTRATE

(71) Applicant: SEMES CO., LTD., Chungcheongnam-do (KR)

(72) Inventors: Oh Jin Kwon, Chungcheongnam-do (KR); Seong-Soo Kim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 244 days.

(21) Appl. No.: 14/744,563

(22) Filed: Jun. 19, 2015

(65) Prior Publication Data

US 2015/0380279 A1    Dec. 31, 2015

(30) Foreign Application Priority Data

Jun. 30, 2014 (KR) .................. 10-2014-0081133

(51) Int. Cl.
*H01L 21/67* (2006.01)

(52) U.S. Cl.
CPC .............................. *H01L 21/67051* (2013.01)

(58) Field of Classification Search
CPC ................ B08B 3/04; H01L 21/67023; H01L 21/67028; H01L 21/6704; H01L 21/67051; Y10S 134/902
See application file for complete search history.

(56) References Cited

U.S. PATENT DOCUMENTS

2006/0222315 A1* 10/2006 Yoshida ............ H01L 21/67051
385/147
2010/0032097 A1* 2/2010 Ohashi .............. H01L 21/67034
156/345.55

FOREIGN PATENT DOCUMENTS

| CN | 101159227 A | 4/2008 |
| JP | 2007-194661 A | 8/2007 |
| JP | 2008-141010 A | 6/2008 |
| KR | 100598916 B1 | 7/2006 |
| KR | 2010-0002080 A | 1/2010 |
| KR | 2011-0052348 A | 5/2011 |

* cited by examiner

*Primary Examiner* — David G Cormier
(74) *Attorney, Agent, or Firm* — Carter, Deluca, Farrell & Schmidt, LLP

(57) ABSTRACT

Disclosed is a substrate treating apparatus which includes a treating container having a treating space therein and including a plurality of collecting vessels surrounding the treating space and provided such that inlets for inputting a fluid in the treating space are vertically stacked on each other, a support unit supporting a substrate in the treating space, a solution supply unit supplying a treating solution to the substrate supported by the support unit, and elevation units respectively joined with the collecting vessels and lifting up and down the collecting vessels. Each of the elevation units includes a base having a ring shape and joined with a corresponding collecting vessel, an elevation load joined with the base, and a driver lifting up and down the elevation load.

15 Claims, 8 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2014-0081133 filed Jun. 30, 2014, in the Korean Intellectual Property Office, the entire contents of which are hereby incorporated by reference.

BACKGROUND

Embodiments of the inventive concepts described herein relate to a substrate treating apparatus, and more particularly, relate to a substrate treating apparatus used to rinse a substrate.

With the high density, high integration and high performance of semiconductor devices, a circuit pattern may be scaled down rapidly. Contamination materials, such as particles, organic contaminants, metallic contaminants, and the like may markedly affect a device characteristic and a production yield. For this reason, a cleaning process for removing various contamination materials attached on a substrate surface may be very important in a semiconductor fabricating process, and a substrate cleaning process may be performed before and after each unit process for fabricating a semiconductor device.

In the KR Patent Publication No. 2011-0116469, there may be illustrated a substrate cleaning apparatus which includes a container provided with a 3-step collecting vessel. In the substrate cleaning apparatus, solutions used for a cleaning process may be exhausted independently of each other, and may be respectively exhausted through solution paths formed at a processing container. In the substrate cleaning apparatus, inlets of collecting vessels may be stacked above and below. All collecting vessels may be driven by a driver to adjust vertical heights between a substrate and the collecting vessels, thereby permitting a processing solution to flow into not a selected collecting vessel but any other collecting vessel in performing a process.

SUMMARY

Embodiments of the inventive concepts provide a substrate processing apparatus capable of efficiently collecting a processing solution.

Also, embodiments of the inventive concepts provide a substrate processing apparatus capable of preventing a processing solution from flowing into not a target collecting vessel but any other collecting vessel at a substrate treating process.

Furthermore, embodiments of the inventive concepts provide a substrate processing apparatus having a new structure of collecting vessel capable of collecting a plurality of processing solutions independently at a substrate treating process.

One aspect of embodiments of the inventive concept is directed to provide a substrate treating apparatus which includes a treating container having a treating space therein and including a plurality of collecting vessels surrounding the treating space and provided such that inlets for inputting a fluid in the treating space are vertically stacked on each other, a support unit supporting a substrate in the treating space, a solution supply unit supplying a treating solution to the substrate supported by the support unit, and elevation units respectively joined with the collecting vessels and lifting up and down the collecting vessels. Each of the elevation units includes a base having a ring shape and joined with a corresponding collecting vessel, an elevation load joined with the base, and a driver lifting up and down the elevation load.

The base may be fixedly joined with an outer wall of the collecting vessel. The elevation load may include a vertical load of which a length direction is provided in an up-and-down direction, and a flange extending from the vertical load in a direction away from the support unit. The driver may be installed on a flange provided at one, different from a corresponding elevation unit, from among the elevation units.

The flange provided at the different elevation unit may be a flange of an elevation unit which is adjacent to an elevation unit having the driver and is provided under the elevation unit.

The collecting vessels may include a first collecting vessel, and a second collecting vessel surrounding the first collecting vessel. The base may include a first base fixed to an outer wall of the first collecting vessel, and a second base placed inside the first base and fixed to an outer wall of the second collecting vessel. The vertical load may include a first vertical load joined with the first base, a length direction of the first vertical load being provided in an up-and-down direction, and a second vertical load joined with the second base and provided in a direction from the first vertical load to the support unit, a length direction of the second vertical load being provided in an up-and-down direction. The flange may include a first flange extending from the first vertical load in a direction away from the support unit.

The collecting vessels may further include a third collecting vessel surrounding the second collecting vessel. The base may further include a third base placed inside the second base and fixed to an outer wall of the third collecting vessel. The vertical load may further include a third vertical load joined with the third base and provided in a direction from the second vertical load to the support unit, a length direction of the third vertical load being provided in an up-and-down direction, and the flange may further include a second flange extending from the third vertical load in a direction away from the support unit and disposed under the first flange.

The driver may include a first driver joined with a bottom surface of the first vertical load and moving the first collecting vessel upward and downward, and a second driver joined with a bottom surface of the second vertical load and fixedly joined with an upper portion of the first flange to move the second collecting vessel upward and downward.

The collecting vessels may further include a third collecting vessel surrounding the second collecting vessel, and the base may further include a third base placed inside the second base and fixed to an outer wall of the third collecting vessel. The vertical load may further include a third vertical load joined with the third base and provided in a direction from the second vertical load to the support unit, a length direction of the third vertical load being provided in an up-and-down direction. The flange may further include a second flange extending in a direction away from the support unit from the third vertical load and disposed under the first flange, and the driver may further include a third driver joined with a bottom surface of the third vertical load and fixedly joined with a top end portion of the second flange to move the third collecting vessel upward and downward.

The first base may include a first inside wall joined in a length direction with a bottom end portion of an outer wall of the first collecting vessel, a first outside wall spaced apart from the first inside wall in a direction away from the support unit and parallel with the first inside wall, and a first bottom wall connected with a bottom surface of the first inside wall and a bottom surface of the first outside wall and provided horizontally. The second base may include a second inside wall joined in a length direction with a bottom end portion of an outer wall of the second collecting vessel, a second outside wall spaced apart from the second inside wall in a direction away from the support unit and parallel with the second inside wall, and a second bottom wall connected with a bottom surface of the second inside wall and a bottom surface of the second outside wall and provided horizontally. The third base may include a third inside wall joined in a length direction with a bottom end portion of an outer wall of the third collecting vessel, a third outside wall spaced apart from the third inside wall in a direction away from the support unit and parallel with the third inside wall, and a third bottom wall connected with a bottom surface of the third inside wall and a bottom surface of the third outside wall and provided horizontally.

The first base may have a first space of which a top end is opened and which is surrounded by the first inside wall, the first outside wall, and the first bottom wall. The second base may have a second space of which a top end is opened and which is surrounded by the second inside wall, the second outside wall, and the second bottom wall. The third base may have a third space of which a top end is opened and which is surrounded by the third inside wall, the third outside wall, and the third bottom wall. The second base may be placed in the first space and the third base may be placed in the second space.

The treating container may further include a base vessel surrounding the collecting vessels and provided in the form of circle.

The collecting vessels may include exhaust lines for discharging collected solutions to the outside.

The exhaust lines may be connected to the outside from bottom surfaces of the collecting vessels, and in the base vessel, exhaust lines may be connected to positions opposite to positions where the exhaust lines of the collecting vessels are provided and are provided to the outside.

The substrate treating apparatus may further include an air current supply unit supplying a descending air current to the treating space, and the collecting vessels may include outlets exhausting an air current through a descending air current provided from the air current supply unit.

The substrate treating apparatus may further include an auxiliary collecting vessel placed outside the collecting vessels, and an auxiliary driver moving the auxiliary collecting vessel upward and downward.

The substrate treating apparatus may further include an auxiliary flange extending from the third vertical load in a direction away from the support unit, and the auxiliary driver is fixedly joined on the auxiliary flange.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
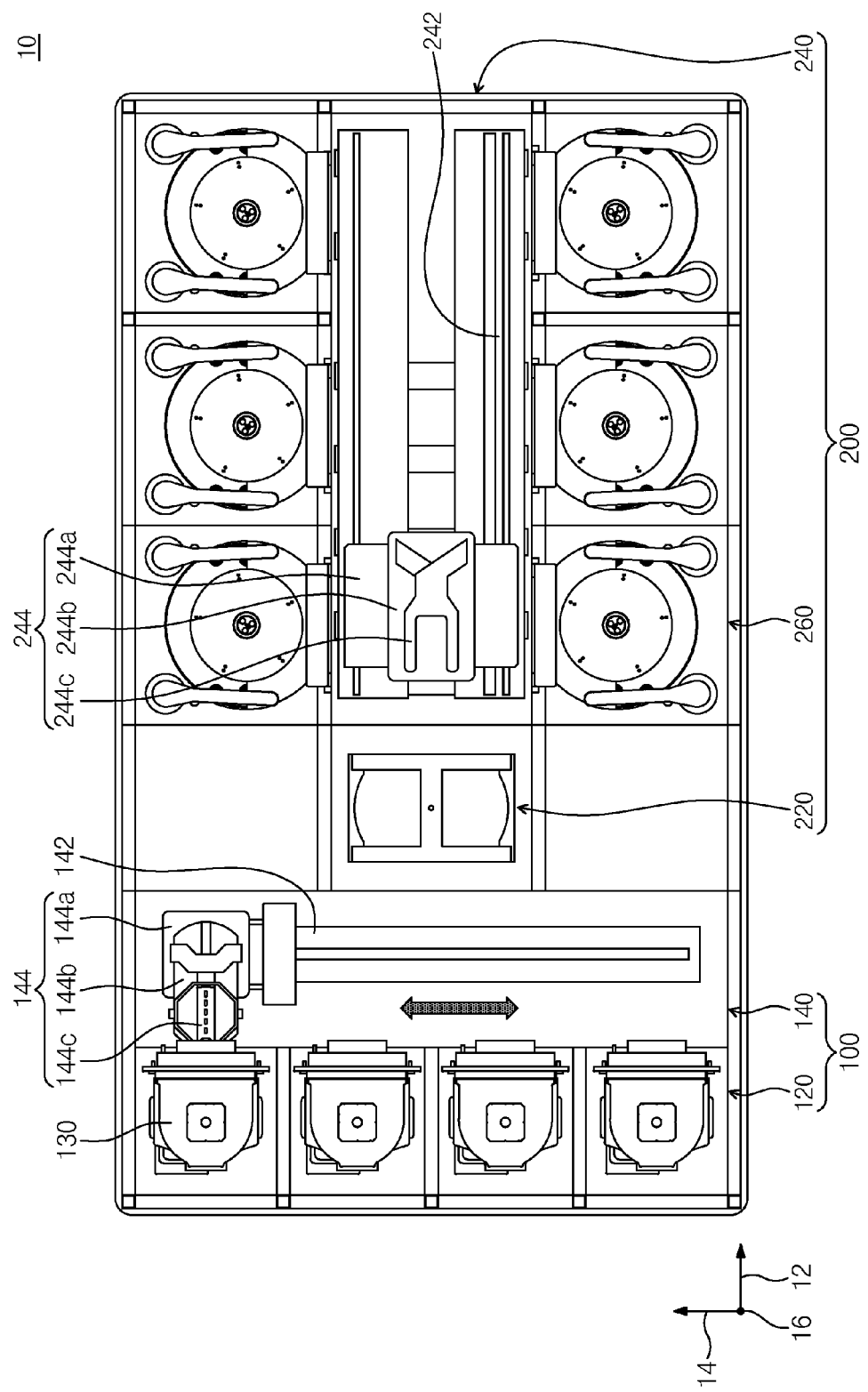
FIG. 1 is a plan view of substrate treating equipment according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

FIG. 1 is a plan view of substrate treating equipment according to an exemplary embodiment of the inventive concept.

Referring to FIG. 1, substrate treating equipment 1 may have an index module 100 and a process treating module 200. The index module 100 may contain a load port 120 and a transfer frame 140. The load port 120, the transfer frame 140, and the process treating module 200 may be arranged sequentially in line. Below, a direction in which the load port 120, the transfer frame 140, and the process treating module 200 are arranged may be referred to as a "first direction" 12. A direction perpendicular to the first direction 12 when viewed from the above may be referred to as a "second direction" 14, and a direction perpendicular to a plane defined by (or including) the first direction 12 and the second direction 14 may be referred to as a "third direction" 16.

A carrier 130 where a substrate W is received may be safely put on the load port 120. The load port 120 may be in plurality, and the plurality of load ports 120 may be arranged in line along the second direction 14. In FIG. 1, an embodiment of the inventive concept is exemplified as the number of load ports 120 is 4. However, the number of load ports 120 may increase or decrease according to conditions such as process efficiency, footprint, etc. A plurality of slots (not shown) may be formed at the carrier 130 so as to support an edge of the substrate W. The slot may be provided in plurality in the third direction 16. The substrates W may be placed in the carrier 130 so as to be stacked at a state where they are spaced apart from each other along the third direction 16. A Front Opening Unified Pod (FOUP) may be used as the carrier 130.

The process treating module 200 may contain a buffer unit 220, a transfer chamber 240, and a process chamber(s) 260. The transfer chamber 240 may be arranged such that its length direction is parallel with the first direction 12. The process chambers 260 may be arranged at both sides of the transfer chamber 240 along the second direction 14. The process chambers 260 may be arranged at one side and the other side of the transfer chamber 240 so as to be symmetrical with the transfer chamber 240 as the center. A portion of the process chambers 260 may be arranged along a length direction of the transfer chamber 240. Also, a portion of the process chambers 260 may be arranged to be stacked on each other. That is, the process chambers 260 may be arranged in an A-by-B matrix at the one side of the transfer chamber 240. Here, "A" may indicate the number of process chambers 260 arranged in line along the first direction 12, and "B" may indicate the number of process chambers 260 arranged in line along the third direction 16. When four or six process chambers 260 are arranged at the one side of the transfer chamber 240, the process chambers 260 may be arranged in a 2-by-2 or 3-by-2 matrix. The number of process chambers 260 may increase or decrease. Unlike the above description, the process chambers 260 may be provided only at one side of the transfer chamber 240. Unlike the above description, the process chambers 260 may be arranged at one side and both sides of the transfer chamber 240 to form a single layer.

The buffer unit 220 may be disposed between the transfer frame 140 and the transfer chamber 240. The buffer unit 220 may provide a space where a substrate W stays before transferred between the transfer chamber 240 and the transfer frame 140. A slot(s) (not shown) where a substrate W is placed may be provided in the buffer unit 220. A plurality of slots may be provided to be spaced from each other along the third direction 16. The buffer unit 220 may have an opened surface that faces the transfer frame 140 and an opened surface that faces the transfer chamber 240.

The transfer frame 140 may transfer a substrate W between the buffer unit 220 and the carrier 130 put on the load port 120. An index rail 142 and an index robot 144 may be provided at the transfer frame 140. The index rail 142 may be provided such that its length direction is parallel with the second direction 14. The index robot 144 may be mounted on the index rail 142 and may move in a straight line toward the second direction 14 along the index rail 142. The index robot 144 may contain a base 144a, a body 144b, and an index arm 144c. The base 144a may be installed to be movable along the index rail 142. The body 144b may be joined to the base 144a. The body 144b may be provided to be movable on the base 144a along the third direction 16. Also, the body 144b may be provided to be rotatable on the base 144a. The index arm 144c may be joined to the body 144b such that it is forward and backward movable relative to the body 144b. The index arm 144c may be in plurality, and the plurality of index arms 144c may be driven independently of each other. The index arms 144c may be arranged to be stacked on each other under the condition that index arms 144c are spaced from each other along the third direction 16. A portion of the index arms 144c may be used to transfer a substrate W from the process treating module 200 to the carrier 130, and a portion of remaining index arms 144c may be used to transfer the substrate W from the process treating module 200 to the carrier 130, thereby preventing particles, generated from a substrate W not experiencing process treating when the substrate W is carried into or out of by the index robot 144, from being attached to the substrate W.

The transfer chamber 240 may transfer a substrate W between the buffer unit 220 and the process chamber 260 and between the process chambers 260. A guide rail 242 and a main robot 244 may be provided at the transfer chamber 240. The guide rail 242 may be arranged such that its length direction is parallel with the first direction 12. The main robot 244 may be installed on the guide rail 242 and may move in a straight line along the first direction 12 on the guide rail 242. The main robot 244 may contain a base 244a, a body 244b, and a main arm 244c. The base 244a may be installed to be movable along the guide rail 242. The body 244b may be joined to the base 244a. The body 244b may be provided to be movable on the base 244a along the third direction 16. Also, the body 244b may be provided to be rotatable on the base 244a. The main arm 244c may be joined to the body 244b such that it is forward and backward movable with respect to the body 144b. The main arm 244c may be in plurality, and the plurality of main arms 244c may be driven independently of each other. The main arms 244c may be arranged to be stacked on each other at a state where the main arms 244c are spaced from each other along the third direction 16. The main arm 244c used to transfer a substrate W from the buffer unit 220 to the process chamber 260 may be different from that used to transfer a substrate W from the process chamber 260 to the buffer unit 220.

The process chamber 260 may contain a substrate treating apparatus 1000 for cleaning a substrate W. A structure of the substrate treating apparatus 1000 may be variable according to a type of a cleaning process. Selectively, the substrate treating apparatuses 1000 of the process chambers 260 may have the same structure. Optionally, the process chambers 260 may be divided into a plurality of groups. In this case, the substrate treating apparatuses 1000 in the same group may have the same structure; on the other hand, the substrate treating apparatuses 1000 in different groups may have different structures. For example, in the case where the process chambers 260 are divided into two groups, process chambers 260 in the first group may be provided at one side of the transfer chamber 240, and process chambers 260 in the second group may be provided at the other side thereof. Selectively, at one side and the other side of the transfer chamber 240, the process chambers 260 in the first group may be provided at a lower layer, and the process chambers 260 in the second group may be provided at an upper layer. The process chambers 260 may be classified into the first group and the second group based on a type of used chemical or a type of used cleaning manner.

Figure 2:
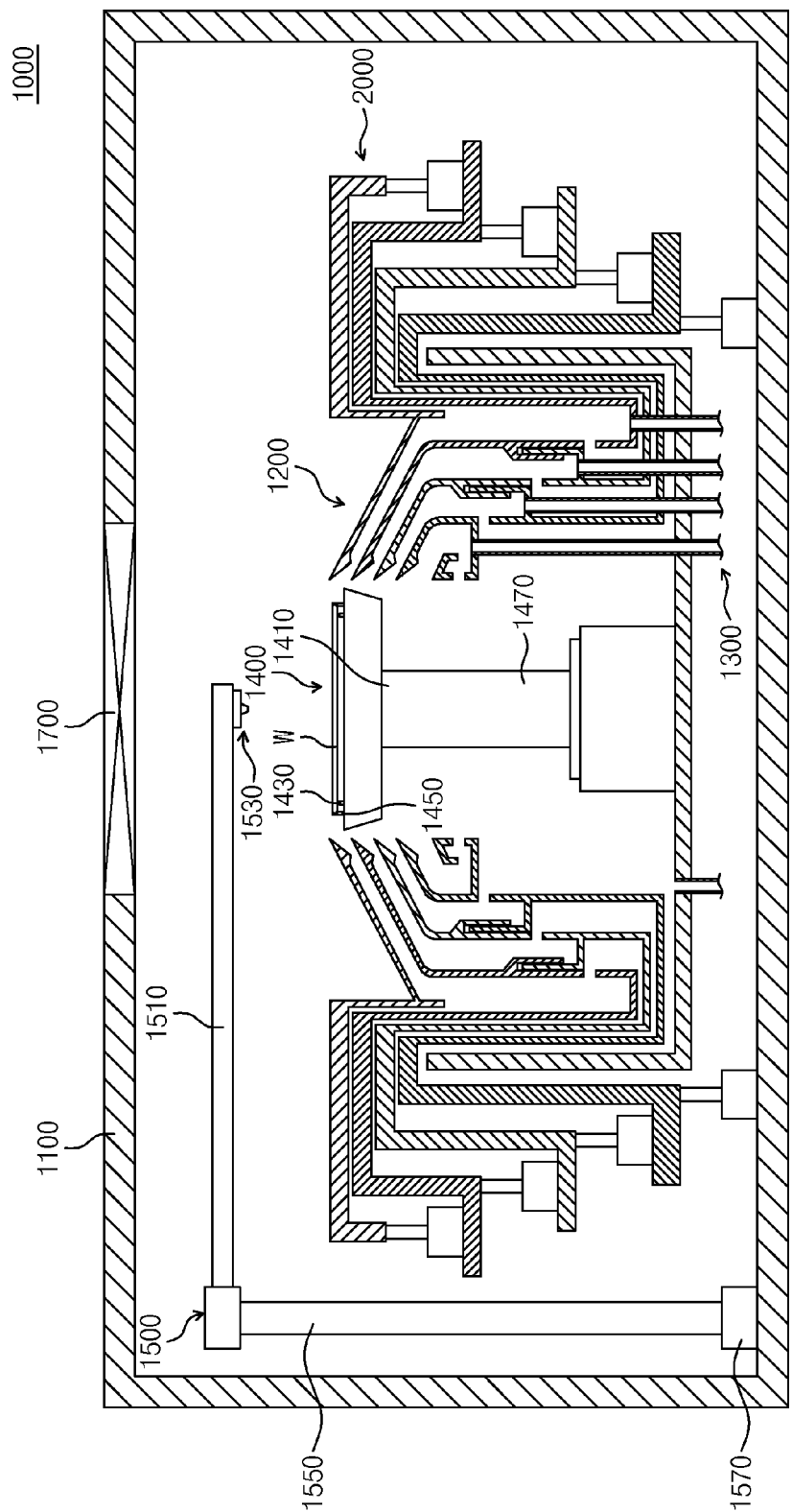
FIG. 2 is a cross-sectional view of a substrate treating apparatus according to an exemplary embodiment of the inventive concept.
Figure 3:
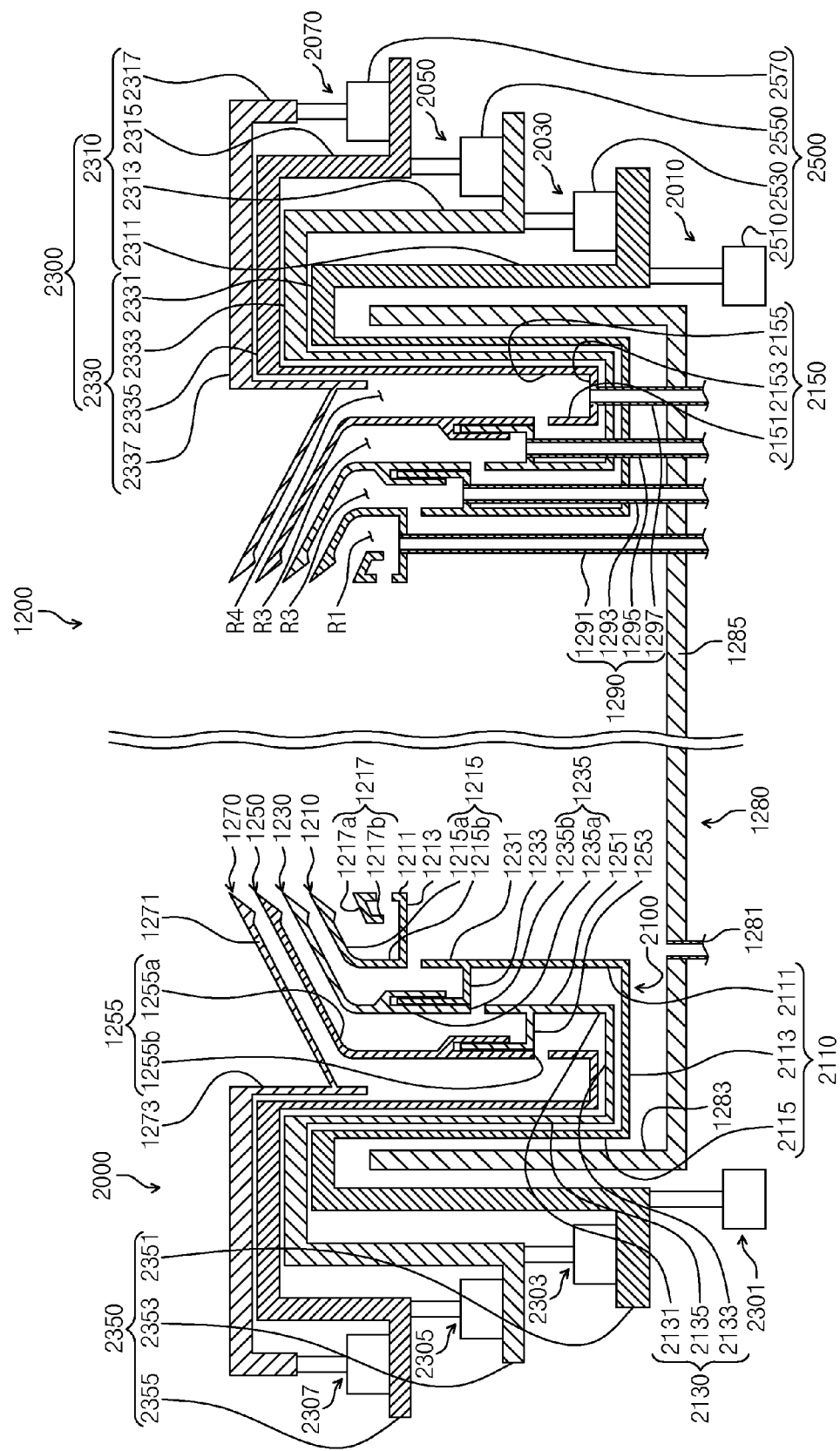
FIG. 3 is a diagram schematically illustrating a processing container and an elevation unit of a substrate treating apparatus of FIG. 2.

Below, there will be described an embodiment of a substrate treating apparatus 1000 for cleaning a substrate W using a treating solution. FIG. 2 is a cross-sectional view of a substrate treating apparatus 1000 according to an exemplary embodiment of the inventive concept.

The substrate treating apparatus 1000 may contain a housing 1100, a treating container 1200, a support unit 1400, a solution supply unit 1600, an elevation unit 2000, and an air current supply unit 1700.

The housing 1100 may provide an airtight internal space. The housing 1100 may be formed in the form of cuboid.

The treating container 1200 may provide a treating space in which a substrate treating process is performed and the top end thereof may be opened. The treating container 1200 may include a first collecting vessel 1210, a second collecting vessel 1230, a third collecting vessel 1250, an auxiliary collecting vessel 1270, and a base vessel 1280.

The collecting vessels 1210, 1230, 1250, and 1270 may be used to collect different treating solutions among treating solutions used for a process. The first collecting vessel 1210 may be provided in the form of ring surrounding the support unit 1400, the second collecting vessel 1230 may be provided in the form of ring surrounding the first collecting vessel 1210, and the third collecting vessel 1250 may be provided in the form of ring surrounding the second collecting vessel 1230. The auxiliary collecting vessel 1270 may be provided in the form of ring surrounding an upper portion of the third collecting vessel 1250. The collecting vessels 1210, 1230, 1250, and 1270 may be stacked above and below, and inlets of the collecting vessels 1210, 1230, 1250, and 1270 may be opened independently by the elevation unit 2000 to be described later. An inner space R1 of the first collecting vessel 1210, a space R2 between the first collecting vessel 1210 and the second collecting vessel 1230, a space R3 between the second collecting vessel 1230 and the third collecting vessel 1250, and a space R4 between the third collecting vessel 1250 and the auxiliary collecting vessel 1270 may constitute a space that allows treating solutions to be provided into the first collecting vessel 1210, the second collecting vessel 1230, the third collecting vessel 1250, and the auxiliary collecting vessel 1270 to then flow into exhaust lines 1290. Connected to the collecting vessels 1210, 1230, 1250, and 1270 are the exhaust lines 1290 that vertically extend downward. The exhaust lines 1290 may exhaust treating solutions flowing in through the collecting vessels 1210, 1230, 1250, and 1270, respectively. The exhausted treating solutions may be recycled through an external treating solution recycling system.

The first collecting vessel 1210 may have an inner wall 1211, a bottom wall 1213, an outer wall 1215, and a guide wall 1217. Each of the inner wall 1211, the bottom wall 1213, the outer wall 1215, and the guide wall 1217 may have a ring shape. The outer wall 1215 may have an inclined wall 1215a downward inclined in a direction away from the support unit 1400 and a vertical wall 1215b vertically extending in a downward direction from a lower end thereof. The bottom wall 1213 may extend from a lower end of the vertical wall 1215b in parallel with a direction facing the support unit 1400. An end portion of the bottom wall 1213 may extend up to the same position as an upper end of the inclined wall 1215a. The inner wall 1211 may extend vertically in an upward direction from an inner end portion of the bottom wall 1213. The inner wall 1211 may extend up to a position at which the upper end of the inner wall 1211 is spaced apart from the upper end of the inclined wall 1215a.

A plurality of openings may be formed at the inner wall 1211 and may be arranged to form a ring shape. Each opening may be provided in the form of slit. The openings may serve as outlets (or exhaust holes) which allow gases flowing in the first collecting vessel 1210 to be exhausted to the outside through a lower space of the support unit 1400. The exhaust line 1291 may be joined with the bottom wall 1213. A treating solution flowing in through the first collecting vessel 1210 may be exhausted through the exhaust line 1291 to an external system for recycling the treating solution.

The guide wall 1217 may have an inclined wall 1217a downward inclined from a spot (or point) vertically spaced apart from the inner wall 1211 (or a top surface thereof) in a direction away from the support unit 1400 and a vertical wall 1217b vertically extending downward from a lower end thereof. A lower end of the vertical wall 1217b may be placed to be spaced apart from the bottom wall 1214. The guide wall 1217 may guide a treating solution flowing in through an inlet so as to smoothly flow into a space R1 surrounded by the outer wall 1215, the bottom wall 1213, and the inner wall 1211.

The second collecting vessel 1230 may include an inner wall 1231, a bottom wall 1233, and an outer wall 1235. The inner wall 1231, the bottom wall 1233, and the outer wall 1235 of the second collecting vessel 1230 may be similar in shape to the inner wall 1211, the bottom wall 1213, and the outer wall 1215 of the first collecting vessel 1210, but since surrounding the first collecting vessel 1210, the size of the second collecting vessel 1230 may be larger than that of the first collecting vessel 1210. An upper end of an inclined wall 1235*a* of the outer wall 1235 in the second collecting vessel 1230 and an upper end of the inclined wall 1215*a* of the outer wall 1215 in the first collecting vessel 1210 may be located to be vertically stacked (or in an up-and-down direction), and when the upper ends are spaced apart from each other, a space between the upper ends may serve as an inlet of the second collecting vessel 1230. An upper end of the inner wall 1231 in the second collecting vessel 1230 may contact with an end portion of the bottom wall 1213 of the first collecting vessel 1210. Slit-shaped outlets (or exhaust holes) for exhausting gases may be provided at the inner wall 1231 of the second collecting vessel 1230 and may be arranged to form a ring. An exhaust line 1293 may be joined with the bottom wall 1233, and a treating solution flowing in through the second collecting vessel 1230 may be exhausted through the exhaust line 1293 to an external system for recycling the treating solution.

The third collecting vessel 1250 may include an inner wall 1251, a bottom wall 1253, and an outer wall 1255. The inner wall 1251, the bottom wall 1253, and the outer wall 1255 of the third collecting vessel 1250 may be similar in shape to the inner wall 1231, the bottom wall 1233, and the outer wall 1235 of the second collecting vessel 1230, but since surrounding the second collecting vessel 1230, the size of the third collecting vessel 1250 may be larger than that of the second collecting vessel 1230. An upper end of an inclined wall 1255*a* of the outer wall 1255 in the third collecting vessel 1250 and an upper end of the inclined wall 1235*a* of the outer wall 1235 in the second collecting vessel 1230 may be located to be stacked in an up-and-down direction, and when the upper ends are spaced apart from each other, a space between the upper ends may serve as an inlet of the third collecting vessel 1230. An exhaust line 1295 may be joined with the bottom wall 1253, and a treating solution flowing in through the third collecting vessel 1250 may be exhausted through the exhaust line 1295 to an external system for recycling the treating solution.

The auxiliary collecting vessel 1270 may have an inclined wall 1271 and an outer wall 1273. The inclined wall 1271 of the auxiliary collecting vessel 1270 may be placed to be stacked on the inclined wall 1255*a* of the third collecting vessel 1250, and when the inclined walls 1271 and 1255*a* are spaced apart from each other, a space between the inclined walls 1271 and 1255*a* may serve as an inlet of the auxiliary collecting vessel 1270.

The base vessel 1280 may surround the treating container 1200 and may be provided in the form of circle. The base vessel 1280 may have an outer wall 1283, a bottom wall 1285, and an exhaust line 1281. The base vessel 1280 may serve as the whole outer wall 1283 of the treating container 1200. The outer wall 1283 may be provided in a direction toward the outside of the treating container 1200 from outer walls of the collecting vessels 1210, 1230, 1250, and 1270. The outer wall 1283 may be provided in the form of ring. A base 2100 and the collecting vessels 1210, 1230, 1250, and 1270 may be provided in the outer wall 1283. An end portion of the bottom wall 1285 may contact with the outer wall 1283. Exhaust lines 1290 may be joined with the bottom wall 1285. The exhaust lines 1290 joined with the bottom wall 1285 may be connected at positions corresponding to the exhaust lines 1291, 1293, 1295, and 1297 joined with the collecting vessels 1210, 1230, 1250, and 1270. Furthermore, an outlet (or exhaust hole) 1281 through which air currents are exhausted may be provided at the bottom wall 1285. Contaminants generated during a substrate treating process may be exhausted through the outlet 1281 together with the air current.

The support unit 1400 may be disposed in the treating container 1200. The support unit 1400 may support and rotate a substrate W during a process. The support unit 1400 may include a body 1410, a support pin 1430, a chuck pin 1450, and a support shaft 1470. The body 1410 may have a top surface provided in the form of circle when viewed from the above. The support shaft 1470 rotated by a motor may be fixedly mounted on a bottom surface of the body 1410. The support pin 1430 may be in plurality. The support pins 1430 may be disposed at an edge of the top surface of the body 1410 so as to be spaced apart from each other and may protrude upward from the body 1410. The support pins 1430 may be disposed to have the form of ring through a combination thereof. The support pin 1430 may support an edge of the rear surface of the substrate W to allow the substrate W to be spaced apart from the top surface of the body 1410. The chunk pin 1450 may be in plurality. The chuck pin 1450 may be disposed such that it is further from the center of the body 1410 than the support pin 1430. The chuck pin 1450 may be provided to protrude upward from the body 1410. The chuck pin 1450 may support a sidewall of the substrate W to prevent the substrate W from leaving from a given position to a lateral direction when the support unit 1400 rotates. The chuck pin 1450 may be provided to move in a straight line between a waiting position and a support position along a radius direction of the body 1410. When the substrate W is loaded on or unloaded from the body 1410, the chuck pin 1450 may be placed at the waiting position; when a substrate treating process is performed, the chuck pin 1450 may be placed at the support position. The chuck pin 1450 may contact with the sidewall of the substrate W at the support position.

A solution supply unit 1500 may supply a treating solution to the substrate W at a substrate treating process. The solution supply unit 1500 may include a nozzle support bar 1510, a nozzle 1530, a support shaft 1550, and a driver 1570. A length direction of the support shaft 1550 may be provided along the third direction 16, and the driver 1570 may be joined with a bottom end portion of the support shaft 1550. The driver 1570 may rotate and lift up or down the support shaft 1550. The nozzle support bar 1510 may be vertically joined with the other end of the support shaft 1550 opposite to one end joined with the driver 1570. The nozzle 1530 may be installed on a lower surface of an end portion of the nozzle support bar 1510. The nozzle 1530 may be shifted into the process position and the waiting position by the driver 1570. The process position may be a position where the nozzle 1530 is disposed over the treating container 1200, and the waiting position may be a position where the nozzle 1530 is not disposed over the treating container 1200. One or more solution supply units 1500 may be provided. In the case where the solution supply unit 1500 is in plurality, chemical, rinse solution, and organic solvent may be provided through different solution supply units 1500, respectively. The rinse solution may be deionized water, and the organic solvent may be a mixture of isopropyl alcohol stream and inactive gas or isopropyl alcohol solution.

The air current supply unit 1700 may supply external air into the housing 1100. The air current supply unit 1700 may be installed at the top of the housing 1100. The air current supply unit 1700 may filter external air of high humidity and supply it into the housing 1100 to form a descending air current. The descending air current may provide a uniform air current on the substrate W.

The elevation unit 2000 may be joined with the collecting vessels 1210, 1230, 1250, and 1270 to lift up and down the collecting vessels 1210, 1230, 1250, and 1270. The elevation unit 2000 may contain a first elevation unit 2010, a second elevation unit 2030, a third elevation unit 2050, and an auxiliary elevation unit 2070. Each of the elevation units 2010, 2030, 2050, and 2070 may have a base 2100, an elevation load 2300, and a driver 2500.

The base 2100 may be joined with the collecting vessels 1210, 1230, and 1250. The base 2100 may include a first base 2110, a second base 2130, and a third base 2150. The elevation load 2300 may be joined with a corresponding driver 2500 to move the collecting vessels 1210, 1230, 1250, and 1270 upward and downward. The elevation load 2300 may include a first elevation load 2301, a second elevation load 2303, a third elevation load 2305, and an auxiliary elevation load 2307. Each elevation load 2300 may include a vertical load 2310, a support portion 2330, and a flange 2350. Each driver 2500 may be joined with a corresponding elevation load 2300 to move a collecting vessel upward and downward.

The support portion 2330 may include an auxiliary support portion provided in combination with the base 2100 and an auxiliary support portion 2337 provided in combination with the auxiliary collecting vessel 1270. The support portion 2330 may be provided in the form of plate. The support portion 2330 may include a first support portion 2331, a second support portion 2333, a third support portion 2335, and the auxiliary support portion 2337. In the support portions 2330, the first support portion 2331, the second support portion 2333, the third support portion 2335, and the auxiliary support portion 2337 may be disposed from the bottom to the top in this order.

The driver 2500 may be joined with the vertical load 2310. The vertical load 2310 may be provided to be perpendicular to the support portion 2330. The vertical load 2310 may be provided to move upward and downward when driven by the driver 2500. The vertical load 2310 may include a first vertical load 2311, a second vertical load 2313, a third vertical load 2315, and an auxiliary vertical load 2317. The first vertical load 2311, the second vertical load 2313, the third vertical load 2315, and the auxiliary vertical load 2317 may be disposed sequentially in a direction away from the support unit 1400, may be provided vertically, and may be provided in parallel with each other.

The flange 2350 may extend from the vertical load 2310 in a direction away from the support unit 1400. The flange 2350 may include a first flange 2351, a second flange 2353, and a third flange 2355. The second flange 2353 may be placed over the first flange 2351, and the third flange 2355 may be placed over the second flange 2353. The flanges 2351, 2353, and 2355 may be provided in parallel.

The first elevation unit 2010 may move the first collecting vessel 1210 upward and downward. The first elevation unit 2010 may include a first base 2110, a first elevation load 2301, and a first driver 2510.

The first base 2110 may be provided in combination with the first collecting vessel 1210. The first base 2110 may be provided in the form of ring. The first base 2110 may include a first inside wall 2111, a first bottom wall 2113, and a first outside wall 2115. The first inside wall 2111 may be provided under the outer wall 1215 of the first collecting vessel 1210. The first inside wall 2111 may be provided to be perpendicular to a length direction of the outer wall 1215. The first outside wall 2115 may extend from the first inside wall 2111 in a direction away from the support unit 1400 and may be provided in parallel with the first inside wall 2111. The first outside wall 2115 may be provided vertically and may be adjacent to the outer wall 1283 of the base vessel 1280. The first base 2110 may provide a first space of which the top end is opened and which is surrounded by the first inside wall 2111, the first outside wall 2115, and the first bottom wall 2113. The first bottom wall 2113 may be connected with a bottom surface of the first inside wall 2111 and a bottom surface of the first outside wall 2115 and may be vertically provided. The first bottom wall 2113 may be joined with an exhaust line 1297 for collecting a treating solution flowing into the auxiliary collecting vessel 1270.

The first elevation load 2301 may be joined with the first base 2110. The first elevation load 2301 may include a first vertical load 2311, a first support portion 2331, and a first flange 2351.

The first support portion 2331 may be provided in combination with the first base 2110. The first support portion 2331 may be provided in the form of plate. The first support portion 2331 may be provided horizontally. The first support portion 2331 may be joined with a top end portion of the first outside wall 2115 and may be provided to be perpendicular to the first outside wall 2115.

The first vertical load 2311 may be provided to be perpendicular to the first support portion 2331 and may be fixedly joined with the first support portion 2331. The first vertical load 2311 may be provided outside the outer wall 1283 of the base vessel 1280 and may be provided to be parallel with the base vessel 1280.

The first flange 2351 may provide a place where the second driver 2530 is put. The first flange 2351 may extend from the first vertical load 2311 in a direction away from the support unit 1400. The first flange may be joined with the first vertical load 2311 and may be provided horizontally. The first flange 2351 may be located under the second flange 2353.

The first driver 2510 may lift up and down the first collecting vessel 1210 joined with the first base 2110. The first driver 2510 may be fixedly joined with the first vertical load 2311. The first driver 2510 may be located under the second driver 2530.

The second elevation unit 2030 may move the second collecting vessel 1230 upward and downward. The second elevation unit 2030 may include a second base 2130, a second elevation load 2303, and a second driver 2530.

The second base 2130 may be provided in combination with the second collecting vessel 1230. The second base 2130 may be provided in the form of ring. The second base 2130 may include a second inside wall 2131, a second bottom wall 2133, and a second outside wall 2135. Shapes of the second inside wall 2131, the second bottom wall 2133, and the second outside wall 2135 of the second base 2130 may be the same as those of the first inside wall 2111, the first bottom wall 2113, and the first outside wall 2115 of the first base 2110. The second base 2130 may be placed in the first space. The second inside wall 2131 may be provided under the outer wall 1235 of the second collecting vessel 1230. The second inside wall 2131 may be provided to be perpendicular to a length direction of the outer wall 1235.

The second outside wall 2135 may extend from the second inside wall 2131 in a direction away from the support unit 1400 and may be provided to be parallel with the second inside wall 2131. The second outside wall 2135 may be placed between the first outside wall 2115 and the third outside wall 2155. The second bottom wall 2133 may be connected with a bottom surface of the inside wall 2111 and a bottom surface of the first outside wall 2115 and may be provided horizontally. The second base 2130 may provide a second space of which the top end is opened and which is surrounded by the second inside wall 2131, the second outside wall 2135, and the second bottom wall 2133. The second bottom wall 2133 may be joined with an exhaust line 1297 for collecting a treating solution flowing into the auxiliary collecting vessel 1270.

The second elevation load 2303 may be joined with the second base 2130. The second elevation load 2303 may include a second vertical load 2313, a second support portion 2333, and a second flange 2353.

The second support portion 2333 may be joined with the second base 2130. The second support portion 2333 may be provided in the form of plate. The second support portion 2333 may be provided horizontally. The second support portion 2333 may be joined with a top end of the second outside wall 2135 and may be provided to be perpendicular to the second outside wall 2135.

The second vertical load 2313 may be provided to be perpendicular to the second support portion 2333 and may be fixedly joined with the second support portion 2333. The second vertical load 2313 may be provided outside the first vertical load 2311 and may be provided to be parallel with the first vertical load 2311.

The second flange 2353 may provide a place where the third driver 2550 is put. The second flange 2353 may extend from the second vertical load 2313 in a direction away from the support unit 1400. The second flange 2353 may be joined with the second vertical load 2313 and may be provided horizontally. The second flange 2353 may be located over the first flange 2351 and under the third flange 2355.

The second driver 2530 may be fixedly joined with the second vertical load 2313. The second driver 2530 may be fixedly joined on the first flange 2351. The second driver 2530 may lift up and down the second collecting vessel 1230 joined with the second base 2130.

The third elevation unit 2050 may move the third collecting vessel 1250 upward and downward. The third elevation unit 2050 may include a third base 2150, a third elevation load 2305, and a third driver 2550.

The third base 2150 may be provided in combination with the third collecting vessel 1250. The third base 2150 may be provided in the form of ring. The third base 2150 may include a third inside wall 2151, a third bottom wall 2153, and a third outside wall 2155. Shapes of the third inside wall 2151, the third bottom wall 2153, and the third outside wall 2155 of the third base 2150 may be the same as those of the second inside wall 2131, the second bottom wall 2133, and the second outside wall 2135 of the second base 2130. The third base 2150 may be placed in the second space. The third inside wall 2151 may be provided under the outer wall 1255 of the third collecting vessel 1250. The third inside wall 2151 may be provided to be perpendicular to a length direction of the outer wall 1255. The third outside wall 2155 may be spaced apart from the third inside wall 2151 in a direction away from the support unit 1400 and may be provided to be parallel with the third inside wall 2151. The third outside wall 2155 may be placed between the second outside wall 2135 and the outer wall 1255 of the third collecting vessel 1250. The third bottom wall 2153 may be connected with a bottom surface of the third inside wall 2151 and a bottom surface of the third outside wall 2155 and may be provided horizontally. The third base 2150 may provide a third space of which the top end is opened and which is surrounded by the third inside wall 2151, the third outside wall 2155, and the third bottom wall 2153. The third bottom wall 2153 may be joined with the exhaust line 1297 for collecting a treating solution flowing into the auxiliary collecting vessel 1270. Connection positions of the exhaust lines 1297 provided at the first base 2110, the second base 2130, and the third bottom wall 2153 of the third base 2150 may be provided to be opposite to each other.

The third elevation load 2305 may be joined with the third base 2150. The third elevation load 2305 may include a third vertical load 2315, a third support portion 2335, and a third flange 2355.

The third support portion 2335 may be joined with the third base 2150. The third support portion 2335 may be provided in the form of plate. The third support portion 2335 may be provided horizontally. The third support portion 2335 may be joined with a top end of the third outside wall 2155 and may be provided to be perpendicular to the third outside wall 2155.

The third vertical load 2315 may be provided to be perpendicular to the third support portion 2335 and may be fixedly joined with the third support portion 2335. The third vertical load 2315 may be provided outside the second vertical load 2313 and may be provided to be parallel with the second vertical load 2313.

The third flange 2355 may provide a place where the auxiliary driver 2570 is put. The third flange 2355 may extend from the third vertical load 2315 in a direction away from the support unit 1400. The third flange 2355 may be joined with the third vertical load 2315 and may be provided horizontally. The third flange 2355 may be located above the second flange 2353.

The third driver 2550 may be fixedly joined with the third vertical load 2315. The third driver 2550 may be fixedly joined on the second flange 2353. The third driver 2550 may lift up and down the third collecting vessel 1250 joined with the third base 2150.

The auxiliary elevation unit 2070 may move the auxiliary collecting vessel 1270 upward and downward. The auxiliary elevation unit 2070 may include an auxiliary elevation load 2307 and an auxiliary driver 2570.

The auxiliary elevation load 2307 may be joined with the auxiliary collecting vessel 2170. The auxiliary elevation load 2307 may include an auxiliary vertical load 2317 and an auxiliary support potion 2337.

The auxiliary support portion 2337 may be provided in combination with an outer wall of the auxiliary collecting vessel 1270. The auxiliary support portion 2337 may be provided in the form of plate. The auxiliary support portion 2337 may be provided horizontally. The auxiliary support portion 2337 may be joined with a top end of the outer wall 1273 and may be provided vertically.

The auxiliary vertical load 2317 may be provided to be perpendicular to the auxiliary support portion 2337 and may be fixedly joined with the auxiliary support portion 2337. The auxiliary vertical load 2317 may be provide outside of the third vertical load 2315 and may be provided to be parallel with the third vertical load 2315.

The auxiliary driver 2570 may be fixedly joined with the auxiliary vertical load 2317. The auxiliary driver 2570 may be fixedly joined on the third flange 2355.

Figure 4:
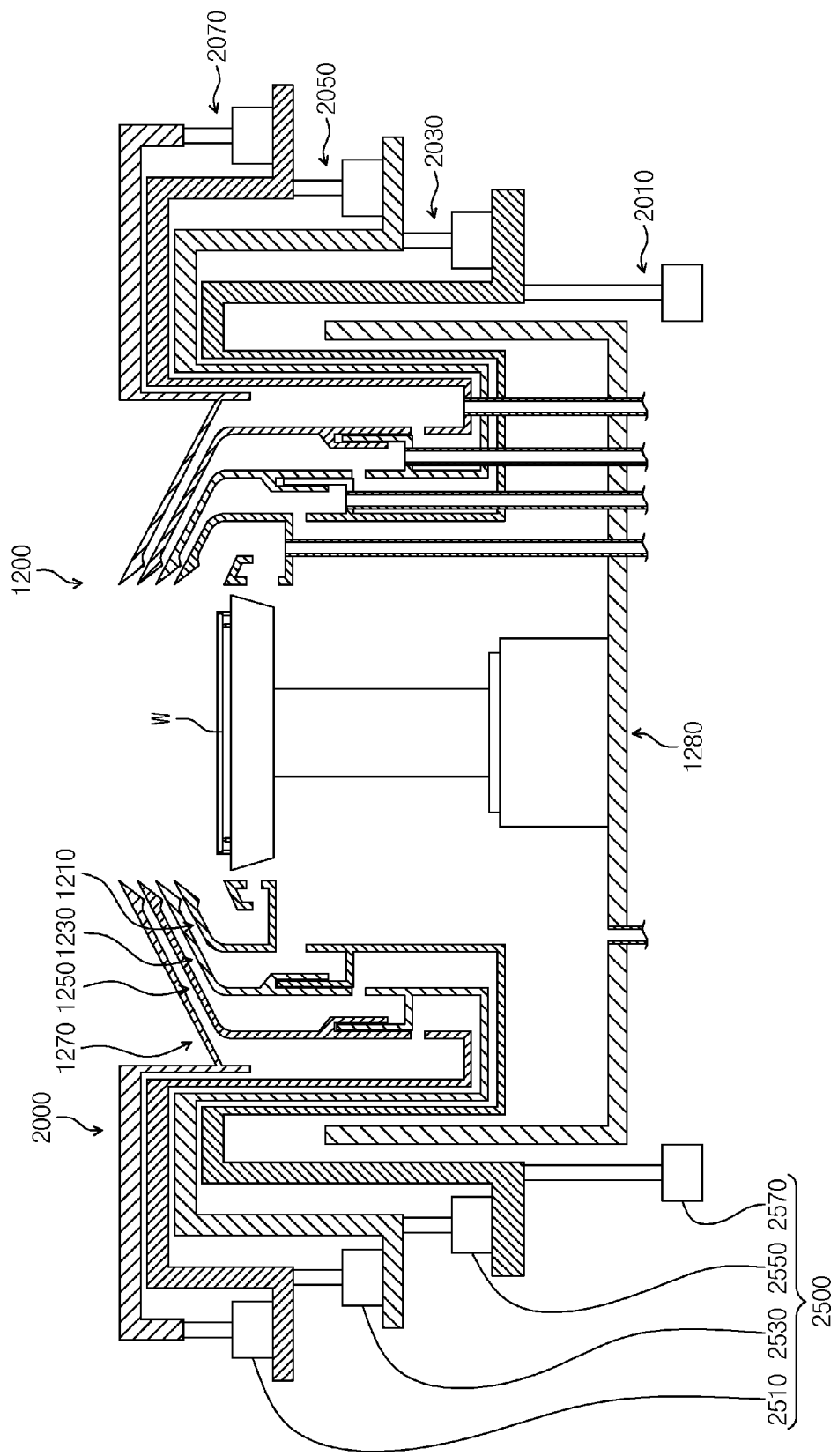
FIGS. 4 to 7 are diagrams schematically illustrating driving of an elevation unit.

FIGS. 4 to 7 are diagrams schematically illustrating driving of an elevation unit. In a substrate treating process may be performed by opening an inlet of one, selected according to a treating solution supplied, from among a plurality of collecting vessels. As illustrated in FIG. 4, during a substrate treating process, a first chemical treating solution may be collected by a first collecting vessel 1210. To collect a first chemical solution, a first driver 2510 may move a first vertical load 2311 upward to allow a first base 2110 and a first collecting vessel 1210 joined therewith to move upward. At this time, since stacked on each other, inlets of collecting vessels placed over the first collecting vessel 1210 may be closed. Since remaining portions all are connected when a first driver 2510 moves upward, a second collecting vessel 1230, a third collecting vessel 1250, and an auxiliary collecting vessel 1270 all may move upward and their inlets may be closed. That is, only an inlet of the first collecting vessel 1210 may be opened. The first chemical solution may be collected through the opened inlet.

Figure 5:
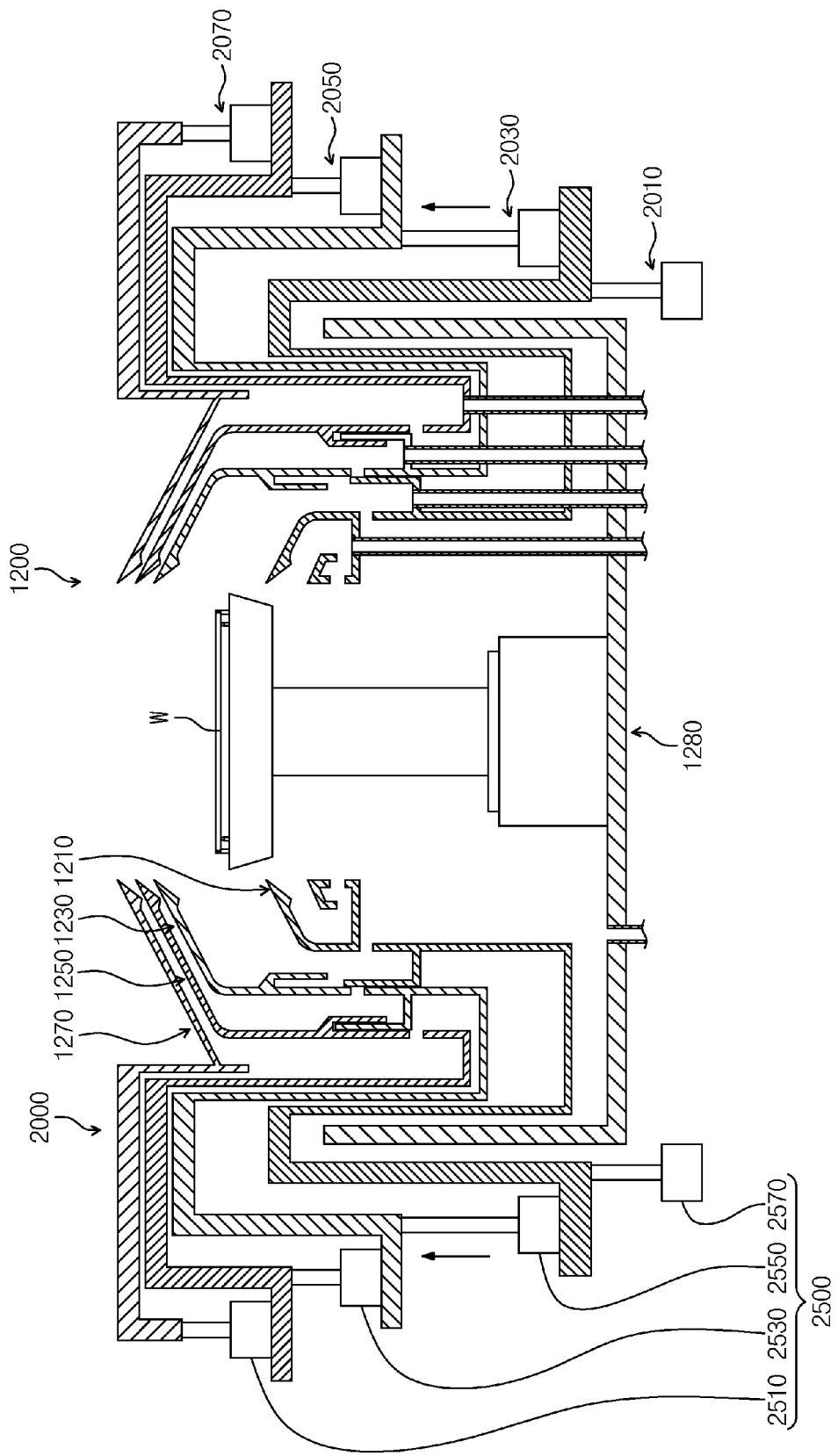

As illustrated in FIG. 5, during a substrate treating process, a second chemical treating solution may be collected by the second collecting vessel 1230. To collect a second chemical solution, a second driver 2530 may move a second vertical load 2313 upward to allow a second base 2130 and a second collecting vessel 1230 joined therewith to move upward. At this time, since stacked on each other, inlets of collecting vessels placed over the second collecting vessel 1230 may be closed. Since remaining portions all are connected when the second driver 2530 moves upward, the third collecting vessel 1250 and the auxiliary collecting vessel 1270 all may move upward and their inlets may be closed. That is, only an inlet of the second collecting vessel 1230 may be opened. Furthermore, since the first collecting vessel 1210 is not associated with connection with the second driver 2530, the first collecting vessel 1210 may not move at an operation of the second driver 2530, and thus, an inlet of the first collecting vessel 1210 may be closed. The second chemical solution may be collected through the opened inlet of the second collecting vessel 1230.

Figure 6:
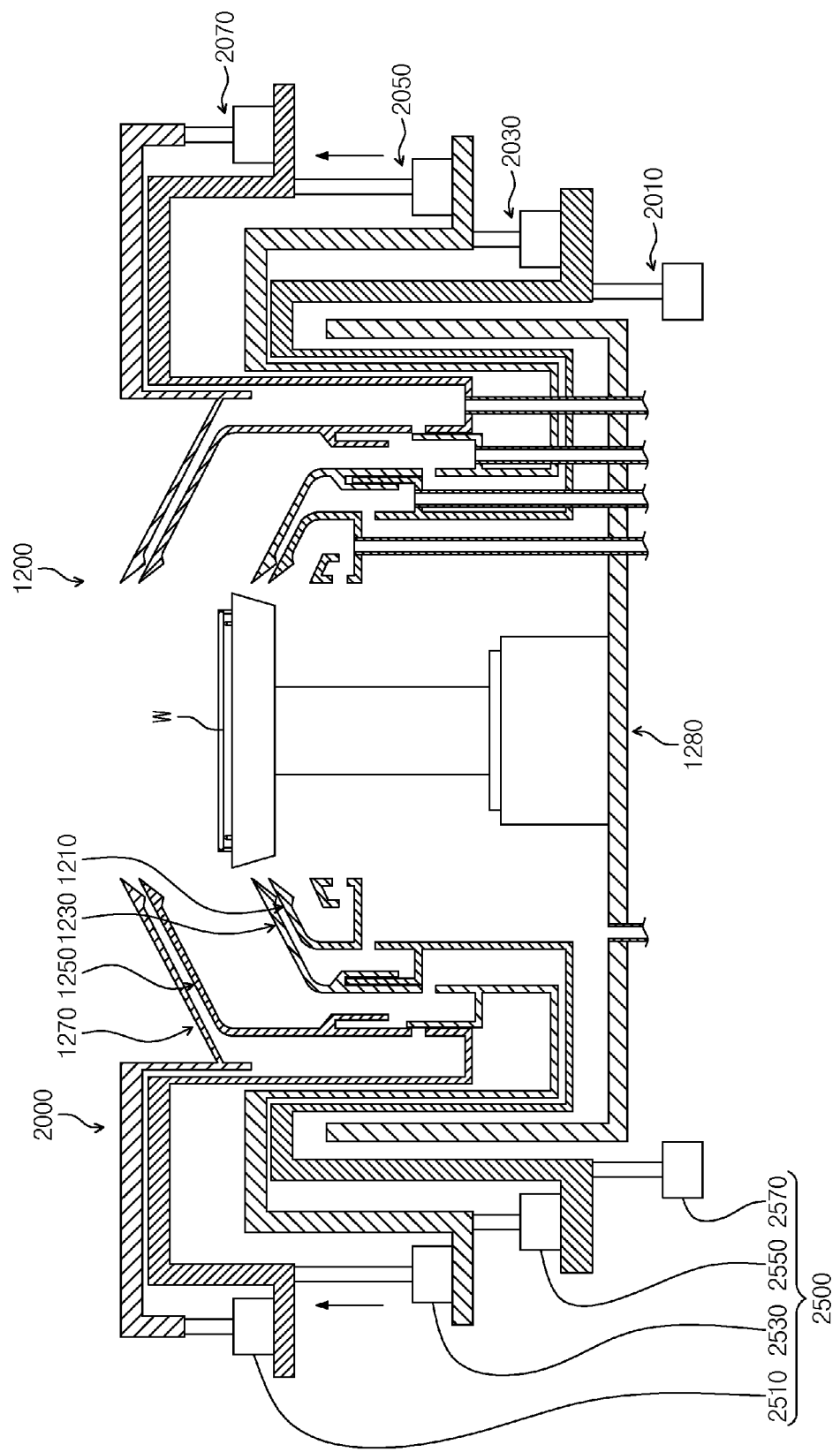

As illustrated in FIG. 6, during a substrate treating process, a rinse solution used to clean a substrate may be collected by an auxiliary collecting vessel 1270. To collect a rinse solution, an auxiliary driver 2570 may move an auxiliary vertical load 2317 upward to allow the auxiliary collecting vessel 1270 joined therewith to move upward. At this time, since stacked on each other, inlets of collecting vessels placed under the auxiliary collecting vessel 1270 may be closed. Although the auxiliary driver 2570 operates, other collecting vessels may not move. That is, only an inlet of the auxiliary collecting vessel 1270 may be opened. The rinse solution may be collected through the opened inlet of the auxiliary collecting vessel 1270.

Figure 7:
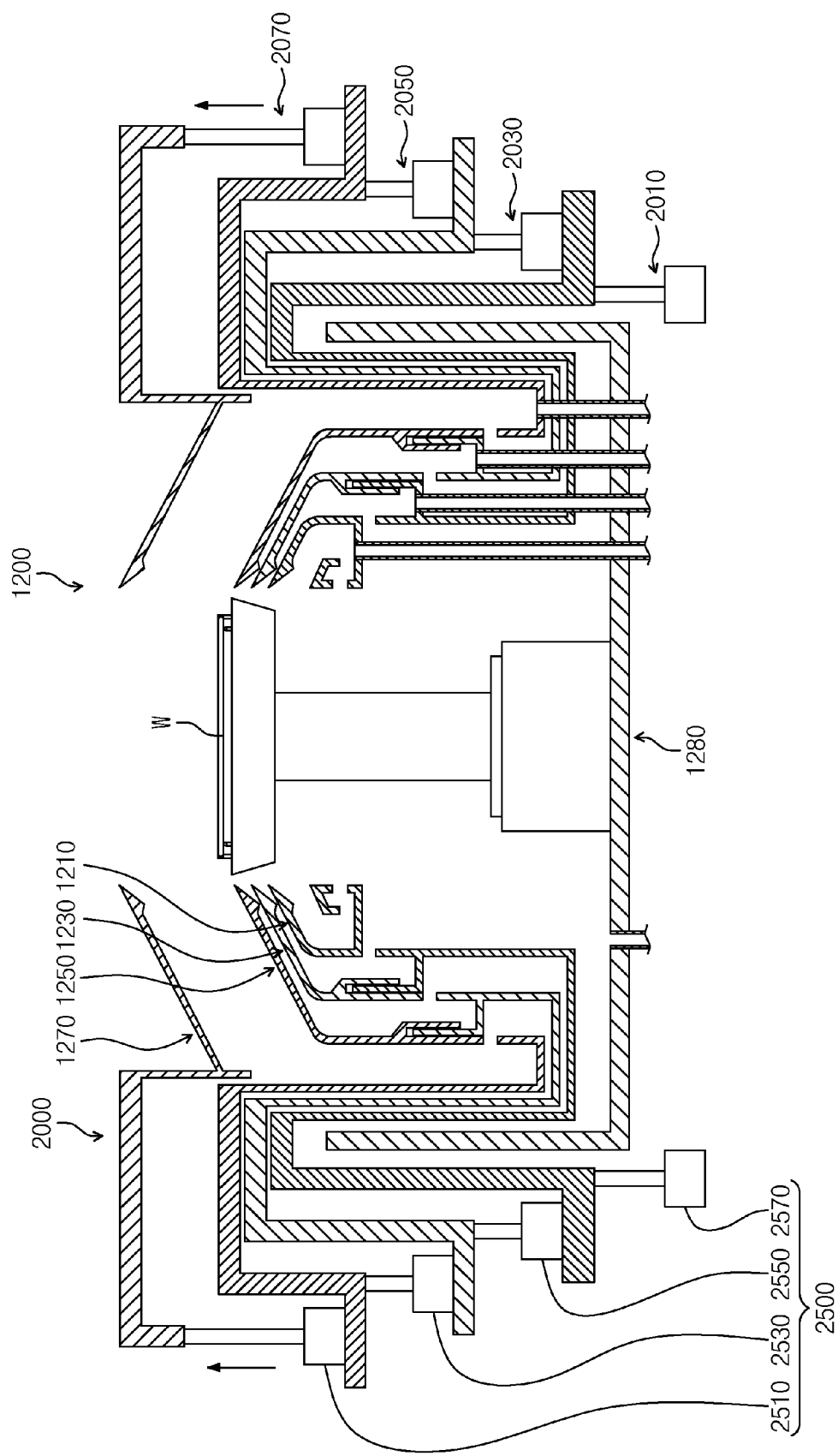

As illustrated in FIG. 7, during a process for treating a substrate using organic solvent, the organic solvent may be collected by opening an inlet of the third collecting vessel 1250. To collect organic solvent, a third driver 2550 may move a third vertical load 2315 upward to allow the third base 2150 and the third collecting vessel 1250 joined therewith to move upward. At this time, since an inlet of the auxiliary collecting vessel 1270 over the third collecting vessel 1250 is closed, only an inlet of the third collecting vessel 1250 may be opened. Furthermore, since the first collecting vessel 1210 and the second collecting vessel 1230 are not associated with connection with the third driver 2550, the first and second collecting vessels 1210 and 1230 may not move at an operation of the third driver 2550, and thus, inlets of the first and second collecting vessels 1210 and 1230 may be closed. The organic solvent may be collected through the opened inlet of the third collecting vessel 1250.

Figure 8:
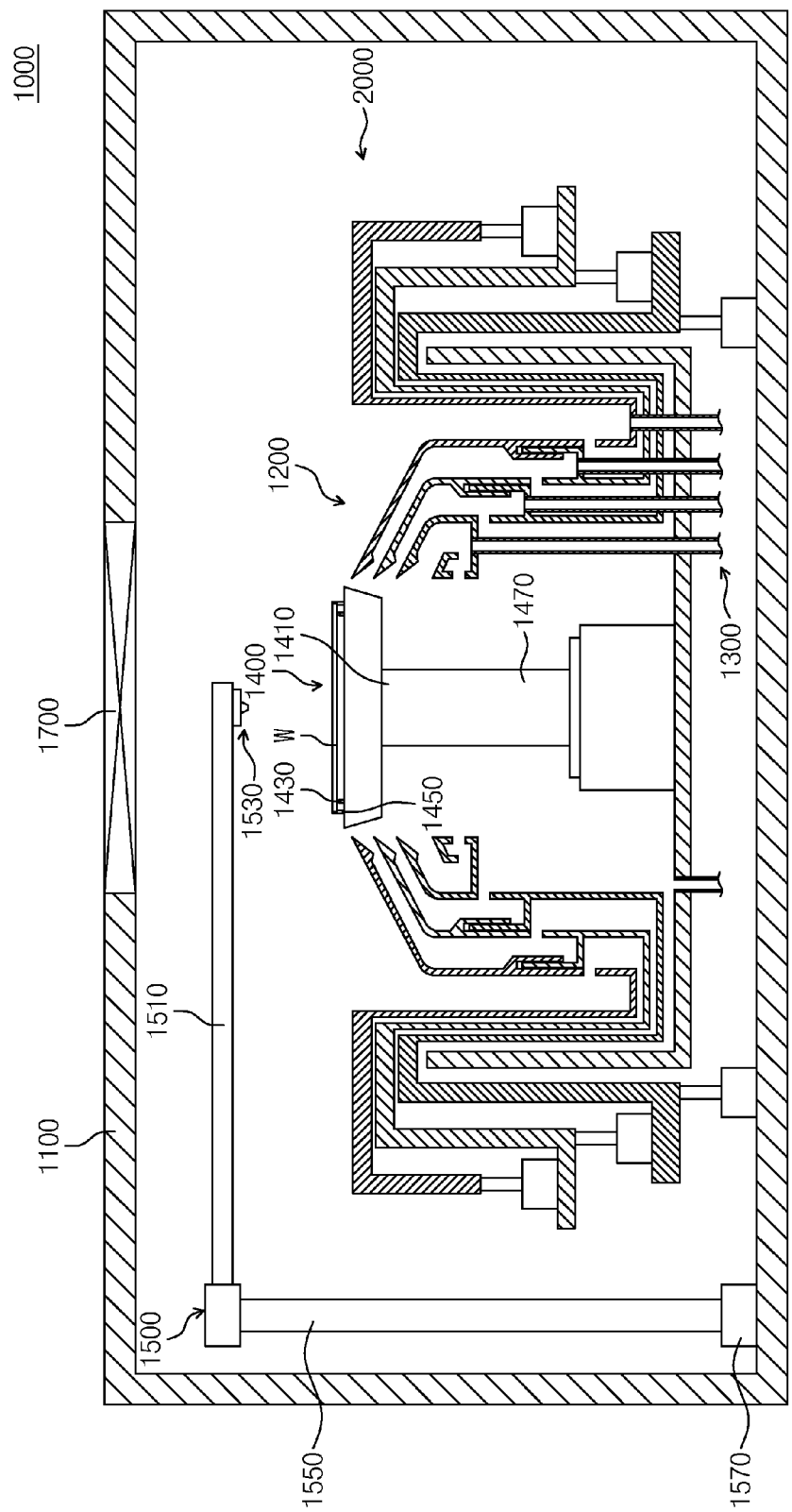
FIG. 8 is a diagram schematically illustrating another embodiment of a substrate treating apparatus of FIG. 2.

FIG. 8 is a diagram schematically illustrating another embodiment of a substrate treating apparatus of FIG. 2. Referring to FIG. 8, a substrate treating apparatus of FIG. 8 may be different from that of FIG. 2 in that the substrate treating apparatus of FIG. 8 does not provide an auxiliary collecting vessel 1270, an auxiliary driver 2570, and a third flange 2355 and includes three collecting vessels.

An embodiment of the inventive concept is exemplified as a substrate treating apparatus includes four collecting vessels. However, the scope and spirit of the inventive concept may not be limited thereto. For example, the inventive concept may be applicable to apparatuses each of which include a plurality of collecting vessels of which the inlets are provided to be stacked on each other and elevations units respectively joined with the plurality of collecting vessels for independent driving.

According to an exemplary embodiment of the inventive concept, it may be possible to efficiently collect a treating solution used at a substrate treating process. Furthermore, it may be possible to prevent a treating solution from flowing into a collecting vessel different from a target collecting vessel for collecting the treating solution. Also, it may be possible to simplify a structure of elevation units capable of independently driving collecting vessels at a substrate treating process.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
 a treating container having a treating space therein and including a first collecting vessel and a second collecting vessel, the first and second collecting vessels surrounding the treating space and provided such that inlets for inputting fluid into the first and second collecting vessels are vertically stacked relative to each other;
 a support unit for supporting a substrate in the treating space;
 a solution supply unit for supplying treating solution to the substrate supported by the support unit;
 a first elevation unit operably coupled to the first collecting vessel; and
 a second elevation unit operably coupled to the second collecting vessel,
 wherein each of the first and second elevation units comprises:
  a base having a ring shape;
  an elevation load joined with the base; and
  a driver lifting up and down the elevation load,
 wherein the second elevation unit is movably supported by the first elevation unit.

2. The substrate treating apparatus of claim 1,
 wherein the base of the second elevation unit is fixedly joined with an outer wall of the second collecting vessel,
 wherein the elevation load of each of the first and second elevation units comprises:
  a vertical load of which a length direction is provided in an up-and-down direction; and a flange extending from the vertical load in a direction away from the support unit, and wherein the driver of the second elevation unit is installed on the flange of the elevation load of the first elevation unit.

3. The substrate treating apparatus of claim 2, wherein the elevation load of the second elevation unit is positioned above the first elevation unit.

4. The substrate treating apparatus of claim 3, wherein:
the base of the first elevation unit is fixed to an outer wall of the first collecting vessel,
the base of the second elevation unit is fixed to the outer wall of the second collecting vessel,
the vertical load of the elevation load of the first elevation unit is joined with the base of the first elevation unit, a length direction of the vertical load of the elevation load of the first elevation unit being provided in an up-and-down direction, and
the vertical load of the elevation load of the second elevation unit is joined with the base of the second elevation unit and provided in a direction away from the vertical load of the elevation load of the first elevation unit, a length direction of the vertical load of the elevation load of the second elevation unit being provided in an up-and-down direction.

5. The substrate treating apparatus of claim 4, further comprising:
a third collecting vessel surrounding the second collecting vessel; and
a third elevation unit comprising:
a base fixed to an outer wall of the third collecting vessel;
a vertical load joined with the base of the third elevation unit and provided in a direction away from the support unit, a length direction of the vertical load of the third elevation unit being provided in an up-and-down direction; and
a flange extending from the vertical load of the third elevation unit in a direction away from the support unit and disposed above the flange of the elevation load of the first elevation unit.

6. The substrate treating apparatus of claim 4, wherein the driver of the first elevation unit is joined with a bottom surface of the vertical load of the first elevation unit, and configured to move the first collecting vessel upward and downward, and
wherein the driver of the second elevation unit is joined with a bottom surface of the vertical load of the second elevation unit, fixedly joined with an upper portion of the flange of the elevation load of the first elevation unit, and configured to move the second collecting vessel upward and downward.

7. The substrate treating apparatus of claim 6, further comprising:
a third collecting vessel surrounding the second collecting vessel; and
a third elevation unit comprising:
a base fixed to an outer wall of the third collecting vessel;
a vertical load joined with the base of the third elevation unit and provided in a direction away from the vertical load of the second elevation unit, a length direction of the vertical load of the third elevation unit being provided in an up-and-down direction;
a flange extending from the vertical load of the third elevation unit in a direction away from the support unit and disposed above the flange of the elevation load of the first elevation unit; and
a driver joined with a bottom surface of the vertical load of the third elevation unit, fixedly joined with a top end portion of the flange of the elevation load of the second elevation unit, and configured to move the third collecting vessel upward and downward.

8. The substrate treating apparatus of claim 5, wherein the base of the first elevation unit comprises:
an inside wall joined in a length direction with a bottom end portion of the outer wall of the first collecting vessel;
an outside wall spaced apart from the inside wall of the base of the first elevation unit in a direction away from the support unit and parallel with the inside wall of the base of the first elevation unit; and
a bottom wall connected with a bottom surface of the inside wall of the base of the first elevation unit and a bottom surface of the outside wall of the base of the first elevation unit and provided horizontally,
wherein the base of the second elevation unit comprises:
an inside wall joined in a length direction with a bottom end portion of the outer wall of the second collecting vessel;
an outside wall spaced apart from the inside wall of the base of the second elevation unit in a direction away from the support unit and parallel with the inside wall of the base of the second elevation unit; and
a bottom wall connected with a bottom surface of the inside wall of the base of the second elevation unit and a bottom surface of the outside wall of the base of the second elevation unit and provided horizontally, and
wherein the base of the third elevation unit comprises:
an inside wall joined in a length direction with a bottom end portion of the outer wall of the third collecting vessel;
an outside wall spaced apart from the inside wall of the base of the third elevation unit in a direction away from the support unit and parallel with the inside wall of the base of the third elevation unit; and
a bottom wall connected with a bottom surface of the inside wall of the base of the third elevation unit and a bottom surface of the outside wall of the base of the third elevation unit and provided horizontally.

9. The substrate treating apparatus of claim 8, wherein the base of the first elevation unit has a space of which a top end is opened and which is surrounded by the inside, outside, and bottom walls of the base of the first elevation unit,
wherein the base of the second elevation unit has a space of which a top end is opened and which is surrounded by the inside, outside, and bottom walls of the base of the second elevation unit,
wherein the base of the third elevation unit has a space of which a top end is opened and which is surrounded by the inside, outside, and bottom walls of the base of the third elevation unit, and
wherein the base of the second elevation unit is placed in the space of the first elevation unit and the base of the third elevation unit is placed in the space of the second elevation unit.

10. The substrate treating apparatus of claim 1, wherein the treating container further comprises:
a base vessel surrounding the first and second collecting vessels.

11. The substrate treating apparatus of claim 10, wherein the first and second collecting vessels comprise exhaust lines for discharging collected solutions to an outside.

12. The substrate treating apparatus of claim 11, wherein the exhaust lines are connected to the outside from bottom surfaces of the first and second collecting vessels, and
   wherein in the base vessel, exhaust lines are connected to positions opposite to positions where the exhaust lines connected to the first and second collecting vessels are provided and are provided to the outside.

13. The substrate treating apparatus of claim 10, further comprising:
   an air current supply unit supplying a descending air current to the treating space,
   wherein the first and second collecting vessels comprise outlets exhausting an air current through a descending air current provided from the air current supply unit.

14. The substrate treating apparatus of claim 7, further comprising:
   an auxiliary collecting vessel placed outside the first, second, and third collecting vessels; and
   an auxiliary driver moving the auxiliary collecting vessel upward and downward.

15. The substrate treating apparatus of claim 14, wherein the auxiliary driver is fixedly joined on the flange of the elevation load of the third elevation unit.

* * * * *